United States Patent [19]

Ferreira

[11] Patent Number: 4,711,836

[45] Date of Patent: Dec. 8, 1987

[54] DEVELOPMENT OF POSITIVE-WORKING PHOTORESIST COMPOSITIONS

[75] Inventor: Lawrence Ferreira, Fall River, Mass.

[73] Assignee: Olin Hunt Specialty Products, Inc., Palisades Park, N.J.

[21] Appl. No.: 895,628

[22] Filed: Aug. 11, 1986

Related U.S. Application Data

[62] Division of Ser. No. 648,568, Sep. 10, 1984.

[51] Int. Cl.$^4$ .......................... G03C 5/00; G03F 7/26
[52] U.S. Cl. .................................. 430/326; 430/149; 430/154; 430/331
[58] Field of Search .............. 430/326, 309, 331, 149, 430/154

[56] References Cited

U.S. PATENT DOCUMENTS

| | | | |
|---|---|---|---|
| 2,308,058 | 1/1943 | Crowley et al. | 95/6 |
| 3,462,269 | 8/1969 | Tassone | 96/55 |
| 3,582,401 | 6/1971 | Berilla et al. | 134/3 |
| 3,595,656 | 7/1971 | Ruckert et al. | 96/49 |
| 4,141,733 | 2/1979 | Guild | 96/49 |
| 4,239,661 | 12/1980 | Muraoka et al. | 252/541 |
| 4,294,911 | 10/1981 | Guild | 430/326 |
| 4,362,809 | 12/1982 | Chen | 430/166 |
| 4,370,405 | 1/1983 | O'Toole et al. | 430/166 |
| 4,374,193 | 2/1983 | Moriya et al. | 430/149 |
| 4,377,631 | 3/1983 | Toukhy et al. | 430/192 |
| 4,395,348 | 7/1983 | Lee | 252/143 |
| 4,411,981 | 10/1983 | Minezaki | 430/299 |
| 4,423,138 | 12/1983 | Guild | 430/326 |

FOREIGN PATENT DOCUMENTS

| | | | |
|---|---|---|---|
| 24872 | 3/1981 | European Pat. Off. | 430/149 |
| 51-56226 | 5/1976 | Japan | 430/331 |
| 162746 | 12/1981 | Japan | 430/326 |

OTHER PUBLICATIONS

Grant, J., *Hackh's Chemical Dictionary*, 4th Ed., 1969, pp. 181, 247 and 601.
Asano, M. et al., Electrochem. Soc. Fall Meeting, Abstract No. 354, pp. 911–913, 1976.
Grant, J., "Hackh's Chemical Dictionary", 4th Ed., p. 513, 1977.
Pacansky, J. IBM Technical Disclosure Bulletin, vol. 20, No. 7, 12/1977, p. 2808.
Frey, D. W., et al., "Edge Profile and Dimensional Control for Positive Photoresist", (1981—Microelectronics Seminar—paper given).

*Primary Examiner*—Charles L. Bowers, Jr.
*Attorney, Agent, or Firm*—William A. Simons; Thomas P. O'Day

[57] ABSTRACT

Disclosed is an aqueous developing solution containing a quaternary ammonium hydroxide developing agent, and as an additive an effective amount of a select compound which is either 1,3,5-trihydroxy benzene, 4-methylesculetin or a novolak-type resin. The aqueous developing solution is particularly useful in developing an imagewise-exposed layer of a positive-working photoresist composition containing a novolak-type resin and a photosensitive agent. In such application, it has been found that the developing solution more effectively removes the exposed portions of the photoresist composition without leaving a residue of exposed photoresist composition at the interface of the edges of the unexposed portions of the photoresist composition and the oxidized silicon substrate.

12 Claims, No Drawings

DEVELOPMENT OF POSITIVE-WORKING PHOTORESIST COMPOSITIONS

This is a division of application Ser. No. 648,568, filed Sept. 10, 1984.

This invention relates to an aqueous developing solution and to its use in providing improved development of positive-working photoresist compositions.

A number of aqueous developing solutions are known in the art for use with positive-working light-sensitive compositions such as photoresists. For example, in U.S. Pat. No. 4,423,138, the aqueous developing solution includes tetraethylammonium hydroxide. It is also known to use tetramethylammonium hydroxide (see British Pat. No. 1,367,830) or methyltriethanol ammonium hydroxide (see U.S. Pat. No. 4,141,733) as the developing agent.

Although aqueous developing solutions containing quaternary ammonium hydroxide compounds have been widely used, they can present a problem when employed in developing certain positive-working photoresists containing a novolak-type resin and a photosensitive agent. In such applications, it has been found that a residue of exposed photoresist may remain on the substrate at the interface of the edges of the unexposed portions of the photoresist and the substrate. This problem has become more serious as integrated circuit device manufacturers continue to strive towards increasing the number of device elements per unit area of solution, as the residue tends to interfere with accurate replication of the desired image pattern.

Now, according to the invention, it has been discovered that the foregoing problem can be overcome by incorporating into an aqueous alkaline developing solution containing a quaternary ammonium hydroxide developing agent an effective amount of an additive compound selected from 1,3,5-trihydroxy benzene, 4-methylesculetin, a novolak-type resin or a mixture thereof. In the practice of the invention, the exposed portions of a positive-working photoresist layer are effectively removed without leaving exposed residual photoresist material at the interface of the edges of the unexposed areas of the photoresist and the substrate. In addition, the aqueous developing solution of the invention provides enhanced photoresist profiles, while showing acceptable performance in regard to such properties as depth of focus, development latitude and retention of unexposed photoresist layer thickness.

In accordance with the present invention, there may be employed any suitable positive-working photoresist composition comprising a solution of a novolak-type resin and a photosensitive agent in a compatible solvent. The solids content of the photoresist composition can vary broadly, but is preferably between about 10 and about 55 percent, and more preferably between about 13 and about 45 percent, by weight.

Any suitable novolak-type resin may be used in the photoresist composition that is employed in the practice of the present invention. Preferably, the novolak-type resin is a cresol-formaldehyde novolak resin or a phenol-formaldehyde novolak resin. The cresol-formaldehyde novolak resins are particularly preferred and are preferably prepared as described in commonly assigned U.S. Pat. No. 4,377,631. Novolak-type resins useful in the present invention include those represented by the following structural formula:

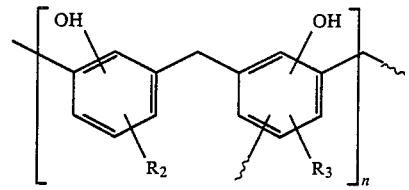

wherein $R_2$ and $R_3$ are independent monovalent $C_1$ to $C_4$ alkyl. Preferably, $R_2$ and $R_3$ are methyl.

The novolak-type resin is present in the photoresist composition in an amount preferably ranging from about 8 to about 44 percent, and more preferably ranging from about 10 to about 35 percent, by weight, based on the total weight of the photoresist composition.

The photosensitive agent is a diazoketone which is insoluble in aqueous alkaline solution and sensitive to radiation in the near ultra violet region of the spectrum, providing, when exposed to such radiation, decomposition products which are soluble in aqueous alkaline solution. Diazoketone compounds which are useful in the practice of the present invention include compounds selected from the group consisting of

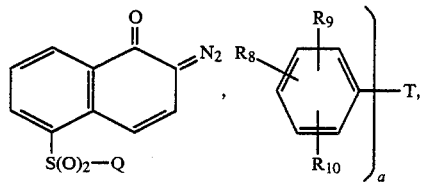

and mixtures thereof, wherein:

Q is —E—$(CH_2)_2$—O—W or 13 E—$C_bX'_{(2b+1)}$;
W is —$CH_3$, —$C_2H_5$, —$(CH_2)_2$—O—$CH_3$ or —$(CH_2)_2$—O—$C_2H_5$;
each X' is independently —H, —F, —Br, —Cl or —I, preferably each X' is —H or the same halogen ion;
a is 1 or 2;
b is 2, 3, 4, 5, 6, 7, 8, or 9;
T is —(CO)—, —O—, —$CH_2$—, —$C(CH_3)_2$—, —S(O)$_2$—, —S—, or —O—Z—O—, when a is 2; and
T is H when a is 1;
Z is —$(CH_2)_2$—or

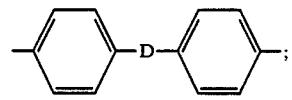

D is —C(O)—, —O—, —$CH_2$—, —$C(CH_3)_2$—, —S(O)$_2$— or —S—;
each $R_8$, $R_9$, and $R_{10}$ is independently —H, —OH, —$NH_2$,

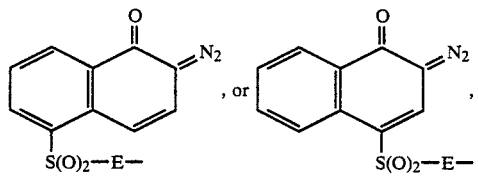

provided: that at least one $R_8$, $R_9$ or $R_{10}$ is

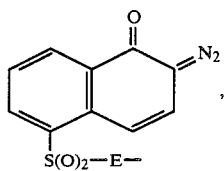

that when T is —O—Z—O—, each $R_{10}$ is H, and that when a is 1, $R_{10}$ is monovalent $C_1$ to $C_9$ alkyl, —C(CH$_3$)$_3$, —H, —OH, NH$_2$,

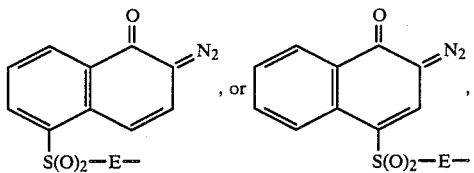

preferably monovalent $C_1$ to $C_9$ alkyl, more preferably —C(CH$_3$)$_3$; and each E is independently —O— or —NH—, preferably —O—; when Z is

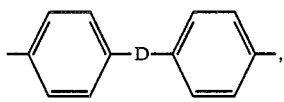

E is preferably —NH—.

Preferably, when a is 2, up to four of the $R_8$, $R_9$ and $R_{10}$ substituents are selected from

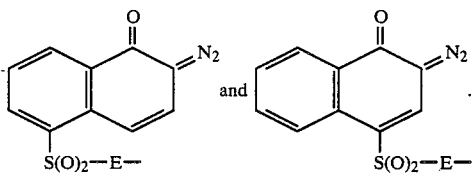

The diazoketone is typically present in the photoresist composition in an amount ranging from about 2 to about 12 percent, preferably ranging from about 3 to about 10 percent, by weight, based on the total weight of the photoresist composition.

The photoresist compositions are formed by adding the novolak-type resin and the photosensitive agent to a solvent in which all of the components are readily soluble. The order of addition is not critical. The solvent is preferably selected from the group consisting of aliphatic ketones, aliphatic esters, alkylene glycol monoalkyl ethers, dialkylene glycol monoalkyl ethers, alkylene glycol dialkyl ethers, and mixtures thereof. A particularly preferred class of aliphatic esters are the aliphatic alkylene glycol alkyl ethyl esters. More preferably, the solvent is selected from the group consisting of cyclohexanone, methylcellosolve acetate, ethylcellosolve acetate, butyl acetate, xylene and mixtures thereof. A particularly preferred solvent is a mixture of ethylcellosolve acetate, butylacetate and xylene. The choice of solvent will depend on the specific novolak-type resin and diazoketone employed.

After the novolak-type resin and the diazoketone have been added to the solvent, the mixture is agitated until all solids are dissolved. The resultant photoresist solution is microfiltered, preferably using a Millipore microfiltration system under about 30 pounds per square inch of pressure of nitrogen or other inert, oxygen-free, ambient atmosphere.

Additives such as dyes, anti-striation agents, plasticizers, adhesion promoters, speed enhancers, and non-ionic surfactants may be added to the solution before it is filtered.

Dye additives useful with the photoresist compositions which are employed in accordance with the present invention include Methyl Violet 2B (C.I. No. 42535), Crystal Violet (C.I. No. 42555), Malachite Green (C.I. No. 42000), Victoria Blue B (C.I. No. 44045) and Neutral Red (C.I. No. 50040) at about 0.1% to about 3% weight levels, based on the total weight of the photoresist composition. The dye additives may help provide increased resolution by inhibiting back scattering of light off the substrate.

Anti-striation agents may be used up to about a 5% weight level, based on the total weight of the photoresist composition.

Plasticizers which may be used include, for example, phosphoric acid tri-(B-chloroethyl)-ester; stearic acid; dicamphor; acetal resins; phenoxy resins; and alkyd resins at about 1% to about 5% weight levels, based on the total weight of the novolak-type resin. The plasticizers improve the coating properties of the material and enable the application to the substrate of a film that is smooth and of uniform thickness.

Adhesion promotors which may be used include, for example, B-(3,4-epoxy-cyclohexyl)-ethyl-trimethoxysilane; p-methyl-disilane-methyl methacrylate; vinyltrichlorosilane; and gamma-amino-propyl triethyoxysilane up to about a 5% weight level, based on the total weight of the photoresist composition.

Speed enhancers that may be used include, for example, picric acid, nicotinic acid or nitrocinnamic acid at a weight level of up to about 5%, based on the weight of the total solids in the photoresist composition. These enhancers tend to increase the solubility of the photoresist coating in both the exposed and unexposed areas, and thus they are used in applications where speed of development is the overriding consideration even though some degree of contrast may be sacrificed. Thus, while the exposed areas of the photoresist coating will be dissolved more quickly by the developer, the speed enhancers will also cause a larger loss of photoresist coating from the unexposed areas.

Non-ionic surfactants that may be used include, for example, nonylphenoxy polyethyleneoxy)ethanol; octylphenoxy(ethyleneoxy)ethanol; and dinonylphenoxy poly(ethyleneoxy)ethanol at up to about 0.5% weight levels, based on the total weight of the photoresist composition.

The filtered photoresist composition can be applied to a suitable substrate or support by any conventional method known to those skilled in the art, including dipping, spraying, whirling and spin coating. The coated substrate or support can then be imagewise-exposed to actinic radiation in a per se well-known manner. Illustrative examples of preparing a photoresist composition, coating it onto a substrate or support, and exposing the coated composition are described in commonly owned, U.S. Pat. No. 4,377,631, the entire disclosure of which is incorporated herein by reference.

The exposed, photoresist coated substrate is then contacted with an aqueous alkaline developing solution of the present invention. This method of contacting is preferably carried out by immersing the coated substrate in the developing solution in, for example, a Teflon tank until all of the photoresist coating has been dissolved from the imagewise-exposed areas. The solution is preferably agitated, for example, by nitrogen burst agitation.

As described hereinabove, the aqueous alkaline developing solution utilized in the practice of the invention contains a quaternary ammonium hydroxide developing agent. Suitable quaternary ammonium hydroxide compounds include those represented by the following structural formula:

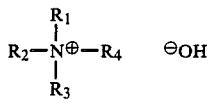

wherein: $R_1$, $R_2$, $R_3$ and $R_4$ are independently $C_1$–$C_4$ alkyl or $C_1$–$C_4$ hydroxyalkyl. A preferred group of quaternary ammonium hydroxide compounds includes tetramethylammonium hydroxide, trimethylethanolammonium hydroxide, methyltriethanolammonium hydroxide, and mixtures thereof. In a particularly preferred embodiment of the invention, tetramethylammonium hydroxide is employed.

The concentration of the quaternary ammonium hydroxide developing agent in the aqueous solution can vary over a wide range depending upon a number of factors such as the particular photoresist composition to which the solution is to be applied, the desired development time, the desired exposure time, and so forth. However, the concentration of the quaternary ammonium developing agent in the aqueous solution will usually range from about 1 to about 30 percent, and preferably from about 3 to about 25 percent, by weight, based on the total weight of the developing solution.

In accordance with the invention, an improvement in the developing solution is effected by adding an effective amount of an additive compound as described hereinabove. By employing the developing solution which includes the select additive compound according to the invention, the exposed areas of the photoresist composition are removed by the developing composition while the unexposed areas are relatively unaffected. Thus, the exposed areas of the photoresist can be removed without leaving residue of exposed photoresist composition at the interface between the edges of the unexposed areas and the substrate.

As previously noted, the additive compound is either 1,3,5-trihydroxy benzene, 4-methylesculetin or a novolak-type resin. The latter type compound is selected from those described above as being suitable for inclusion in the photoresist composition. It should be noted that the novolak-type resin which is added to the developing solution may be the same as or different than that included in the photoresist composition. Preferably, the novolak-type resin additive in the developing composition is a cresol-formaldehyde novolak resin. In a particularly preferred embodiment of the invention, 1,3,5-trihydroxy benzene is employed.

The select additive compound can be employed in any amount that is effective in completely removing the exposed areas of the photoresist composition without leaving a residue of exposed photoresist composition as described hereinabove. The optimum amount to be used in a particular application will actually depend upon a number of factors, such as the particular developing agent utilized in the developing solution, the concentration of the developing agent in the developing solution, the exact photoresist composition to which the solution is to be applied, and the like. Generally, however, the additive compound will be included in the developing solution in an amount ranging from about 0.1 to about 5 percent, and preferably from about 0.2 to about 4 percent, by weight, based on the total weight of the developing solution.

It is preferred that the developing solution that is utilized be free, or at least substantially free, of metal ions such as the alkaline earth metals and the transmition metals. Accordingly, in a preferred embodiment the developing solution also includes a chelating agent. Any suitable chelating agent may be used, such as ethylene diamine tetraacetic acid as well as other conventional compounds, well known to those skilled in the art. Preferably, the chelating agent is used in an amount up to about 1 percent, by weight, based on the total weight of the developing solution.

The aqueous alkaline developing solution can optionally contain various other standard ingredients as will be apparent to those skilled in the art. For example, the developing solution may also include dyes and/or pigments, non-ionic surfactants, and the like.

It also should be apparent to those skilled in the art that an aqueous concentrate can be prepared which can be diluted prior to use as the developing solution in accordance with the method of the invention. This can be advantageous in that it reduces the amount of water which must be stored and shipped.

Typical development conditions include a development temperature of about $21°\pm1°$ C., with a development time depending largely upon such factors as the particular photoresist composition utilized, the exposure energy, the concentration of the developing agent in the developing solution, the developer mode such as spray, puddle, nitrogen burst submersion or mechanical agitation, pre-bake temperature and time, and so forth. For example, under mild (magnetic bar) agitation, the developing time is typically about 60 seconds for 1 micron coatings pre-baked at about 100°–105° C. for about 30 minutes.

The following examples are provided to illustrate the invention. All parts and percentages are by weight unless otherwise noted.

EXAMPLES 1–9 AND COMPARATIVE EXAMPLES 1–3

The following procedure was followed in each of the Examples and Comparative Examples.

In all of the following Examples and Comparative Examples, the photoresist composition[1] that was employed is commercially available under the designation "HPR-204" from the Philip A. Hunt Chemical Corporation, Palisades Park, N.J., and contains a cresol-formaldehyde novolak-resin and, as a photosensitive agent, a naphthoquinone diazide sulfonic acid ester of trihydroxybenzophenone.

The photoresist composition was applied to 3-inch diameter oxidized silicon wafers by spin coating at 5000 rpm for 30 seconds on a Headway spinner to provide a film thickness of about 1 micron. The coated wafers were then prebaked at 100°–105° C. for 30 minutes in a convection oven. The prebaked wafers were exposed through a Focus Wedge mask on a Perkin Elmer Micralign 110 (1.0 mm slit width, aperture #1). The exposed wafers were developed for about 60 seconds by immersion utilizing each of the aqueous alkaline developing solutions listed in Table I below.

The removal characteristics of each aqueous solution were examined by employing a scanning electron microscope. Developed wafers were sputter coated with 250 Angstroms gold and three micron window dimensions examined at 17,000X magnification (80° sample tilt angle). Each developed wafer was then given a rating on a numerical scale of 0–5, the lowest number (0) indicating complete removal of the exposed regions of the photoresist and the highest (5) reflecting a substantial residue of exposed photoresist at the interface of the edges of the unexposed portions and the oxidized substrate. The results are summarized in Table I below.

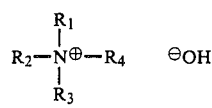

wherein $R_1$, $R_2$, $R_3$ and $R_4$ are independently $C_1$–$C_4$ alkyl or $C_1$–$C_4$ hydroxyalkyl.

3. The method of claim 2, wherein said quaternary ammonium hydroxide developing agent is selected from the group consisting of tetramethylammonium hydroxide, trimethylethanolammonium hydroxide, methyltriethanolammonium hydroxide, and mixtures thereof.

4. The method of claim 3, wherein said quaternary ammonium hydroxide developing agent is employed in an amount ranging from about 3 percent to about 25 percent by weight, based on the total weight of said developing solution.

5. The method of claim 3, wherein said additive compound is employed in an amount ranging from about 0.2 percent to about 4 percent by weight, based on the total weight of said developing solution.

6. The method of claim 5, wherein said additive compound is 1,3,5-trihydroxy benzene.

7. The method of claim 1, wherein said novolak-type resin has the formula

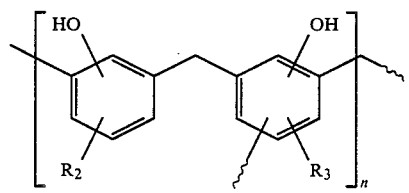

wherein $R_1$ and $R_2$ are independently monovalent $C_1$–$C_4$ alkyl.

8. The method of claim 1, wherein said photosensitive agent is a diazoketone compound selected from the group consisting of

TABLE I

| Example or Comparative Example No. | Quaternary Ammonium Hydroxide Developing Agent[1] | | Additive | | Result |
|---|---|---|---|---|---|
| | Ingredient[2] | Amount (% by wt.) | Ingredient | Amount (% by wt.) | |
| CE-1 | TMAH | 2.7 | — | — | 5 |
| 1 | TMAH | 2.7 | novolak-type resin[3] | 0.18 | 3 |
| 2 | TMAH | 2.9 | novolak-type resin[3] | 0.57 | 0 |
| 3 | TMAH | 2.7 | novolak-type resin[3] | 0.88 | 0 |
| 4 | TMAH | 2.7 | 1,3,5-trihydroxy benzene | 0.02 | 2 |
| 5 | TMAH | 2.7 | 1,3,5-trihydroxy benzene | 0.22 | 0 |
| CE-2 | MTEAH | 11.7 | — | — | 5 |
| 6 | MTEAH | 11.7 | 1,3,5-trihydroxy benzene | 0.52 | 0 |
| CE-3 | TMEAH | 5.9 | — | — | 5 |
| 7 | TMEAH | 5.8 | 1,3,5-trihydroxy benzene | 0.48 | 0 |
| 8 | TMAH | 2.7 | 4-methylesculetin | 0.14 | 1 |
| 9 | TMAH | 2.7 | 4-methylesculetin | 0.26 | 0 |

[1]Each of the developing solutions containing TMAH also included about 0.1% by weight of ethylene diamine tetraacetic acid. It also should be noted that the remaining component of all of the developing solutions employed in the Examples and Comparative Examples was water.

[2]The following abreviations are used: TMAH = tetramethylammonium hydroxide; MTEAH = methyltriethanolammonium hydroxide; and TMEAH = trimethylethanolammonium hydroxide.

[3]A novolak-type resin prepared from a 45% m-cresol/55% p-cresol mixture and having a softening point of about 140–160° C.

What is claimed is:

1. A method of developing an imagewise-exposed layer of positive-working photoresist composition comprising the steps of:
   applying a layer of a positive-working photoresist composition to a substrate; said photoresist composition comprising an admixture of a novolak-type resin and diazoketone photosensitive agent;
   subjecting said photoresist layer to an imagewise-exposure of radiation;
   contacting the imagewise-exposed layer to an aqueous alkaline developing solution comprising an admixture of a quaternary ammonium hydroxide developing agent with an effective amount of an additive compound selected from the group consisting of 1,3,5-trihydroxybenzene, 4-methylesculetin, and mixtures thereof;
   removing the imagewise-exposed areas of said photoresist compositions without leaving exposed residual photoresist material at the interface of the edges of the unexposed areas of the photoresist layer and the substrate.

2. The method of claim 1, wherein said quaternary ammonium hydroxide developing agent has the formula

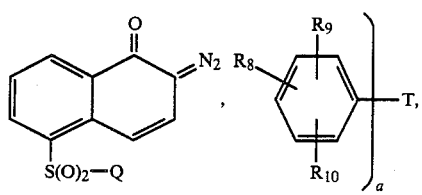

and mixtures thereof, wherein:

Q is —E—(CH$_2$)$_2$—O—W or —E—C$_b$X'$_{(2b+1)}$;

W is —CH$_3$, —C$_2$H$_5$, —(CH$_2$)$_2$—O—CH$_3$ or —(CH$_2$)$_2$—O—C$_2$H$_5$;

each X' is independently —H, —F, —Br, —Cl or —I;

a is 1 or 2;

b is 2, 3, 4, 5, 6, 7, 8 or 9;

T is —(CO)—, —O—, —CH$_2$—, —C(CH$_3$)$_2$—, —S(O)$_2$—, —S—, or —O—Z—O—, when a is 2 and T is H when a is 1;

Z is —(CH$_2$)$_2$— or

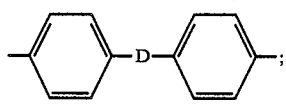

D is —C(O)—, —O—, —CH$_2$—, —C(CH$_3$)$_2$—, —S(O)$_2$— or —S—;

each R$_8$, R$_9$ and R$_{10}$ is independently —H, —OH, —NH$_2$,

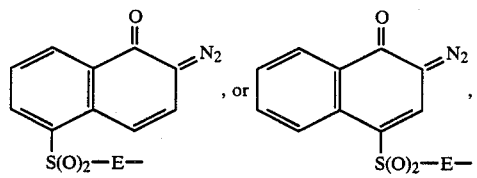

provided: that at least one R$_8$, R$_9$ or R$_{10}$ is

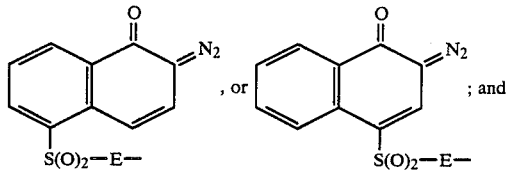

that when T is —O—Z—O—, each R$_{10}$ is H, and that when a is 1, R$_{10}$ is monovalent C$_1$ to C$_9$ alkyl, —C(CH$_3$)$_3$, —H, —OH, —NH$_2$,

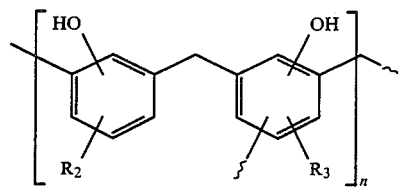

each E is independently —O—, or —NH—.

9. The method of claim 8, wherein said novolak-type resin has the formula

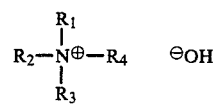

wherein R$_1$ and R$_2$ are independently monovalent C$_1$–C$_4$ alkyl.

10. The method of claim 9, wherein said quaternary ammonium hydroxide developing agent has the formula $$\begin{array}{c} R_1 \\ | \\ R_2-N^{\oplus}-R_4 \quad \ominus OH \\ | \\ R_3 \end{array}$$

wherein R$_1$, R$_2$, R$_3$ and R$_4$ are independently C$_1$–C$_4$ alkyl or C$_1$–C$_4$ hydroxyalkyl.

11. The method of claim 10, wherein said quaternary ammonium hydroxide developing agent is employed in an amount ranging from about 3 percent to about 25 percent, and wherein said additive compound is employed in an amount ranging from about 0.2 percent to about 4 percent, both amounts being by weight, based on the total weight of said developing solution.

12. The method of claim 11, wherein said quaternary ammonium hydroxide developing agent is tetramethylammonium hydroxide and wherein said additive compound is 1,3,5-trihydroxy benzene.

* * * * *